US010627195B2

(12) United States Patent
Nerheim et al.

(10) Patent No.: US 10,627,195 B2
(45) Date of Patent: Apr. 21, 2020

(54) METHODS AND APPARATUS FOR DETECTING A VOLTAGE OF A STIMULUS SIGNAL OF A CONDUCTED ELECTRICAL WEAPON

(71) Applicant: Axon Enterprise, Inc., Scottsdale, AZ (US)

(72) Inventors: Magne Nerheim, Paradise Valley, AZ (US); Steven N. D. Brundula, Sedro-Woolley, WA (US)

(73) Assignee: Axon Enterprise, Inc., Scottsdale, AZ (US)

( * ) Notice: Subject to any disclaimer, the term of this patent is extended or adjusted under 35 U.S.C. 154(b) by 0 days.

(21) Appl. No.: 16/002,395

(22) Filed: Jun. 7, 2018

(65) Prior Publication Data

US 2019/0041171 A1 Feb. 7, 2019

Related U.S. Application Data

(60) Provisional application No. 62/539,959, filed on Aug. 1, 2017.

(51) Int. Cl.
  *F41C 9/00* (2006.01)
  *F41H 13/00* (2006.01)
  *H05C 1/06* (2006.01)

(52) U.S. Cl.
  CPC ..... *F41H 13/0025* (2013.01); *F41H 13/0018* (2013.01); *H05C 1/06* (2013.01)

(58) Field of Classification Search
  CPC ... F41H 13/0018; F41H 13/0025; H05C 1/04; H05C 1/06
  See application file for complete search history.

(56) References Cited

U.S. PATENT DOCUMENTS

| | | | |
|---|---|---|---|
| 9,395,147 B2 | 7/2016 | Gagnon et al. | |
| 9,903,690 B1* | 2/2018 | Nerheim | F41H 13/0025 |
| 9,939,232 B2 | 4/2018 | Nerheim | |
| 2005/0188888 A1 | 9/2005 | Watkins, III et al. | |
| 2007/0070574 A1* | 3/2007 | Nerheim | F41A 17/063 361/232 |
| 2007/0081293 A1* | 4/2007 | Brundula | F41H 13/0018 361/232 |
| 2008/0158769 A1* | 7/2008 | Brundula | F41H 13/0025 361/232 |
| 2009/0319007 A1 | 12/2009 | McNulty, Jr. | |

(Continued)

FOREIGN PATENT DOCUMENTS

| | | |
|---|---|---|
| CN | 101410689 A | 4/2009 |
| TW | 200949188 A | 12/2009 |

OTHER PUBLICATIONS

Taiwan Patent Office, Taiwan Office Action and Search Report for Taiwan patent application No. 107121430 dated Apr. 30, 2019.

(Continued)

*Primary Examiner* — Gabriel J. Klein
(74) *Attorney, Agent, or Firm* — Letham Law Firm

(57) ABSTRACT

Methods and apparatus for detecting a magnitude of a voltage at a face of a conducted electrical weapon ("CEW"). The magnitude of the voltage may be used to determine whether a pulse of a stimulus signal was delivered to a target. Structures for detecting the magnitude of the voltage may include structures that provide a stimulus voltage.

13 Claims, 8 Drawing Sheets

(56) References Cited

U.S. PATENT DOCUMENTS

| | | |
|---|---|---|
| 2011/0096459 A1 | 4/2011 | Smith |
| 2014/0025328 A1 | 1/2014 | Burns et al. |
| 2014/0098453 A1* | 4/2014 | Brundula ............... F41H 5/24 361/232 |

OTHER PUBLICATIONS

Korean Intellectual Property Office, International Search Report for PCT Application No. PCT/US2018/036509 dated Sep. 14, 2018, pp. 1-8. Unpublished.

* cited by examiner

US 10,627,195 B2

METHODS AND APPARATUS FOR DETECTING A VOLTAGE OF A STIMULUS SIGNAL OF A CONDUCTED ELECTRICAL WEAPON

FIELD OF INVENTION

Embodiments of the present invention relate to conducted electrical weapons.

BRIEF DESCRIPTION OF THE SEVERAL VIEWS OF THE DRAWING

Embodiments of the present invention will be described with reference to the drawing, wherein like designations denote like elements, and.

Figure 1:
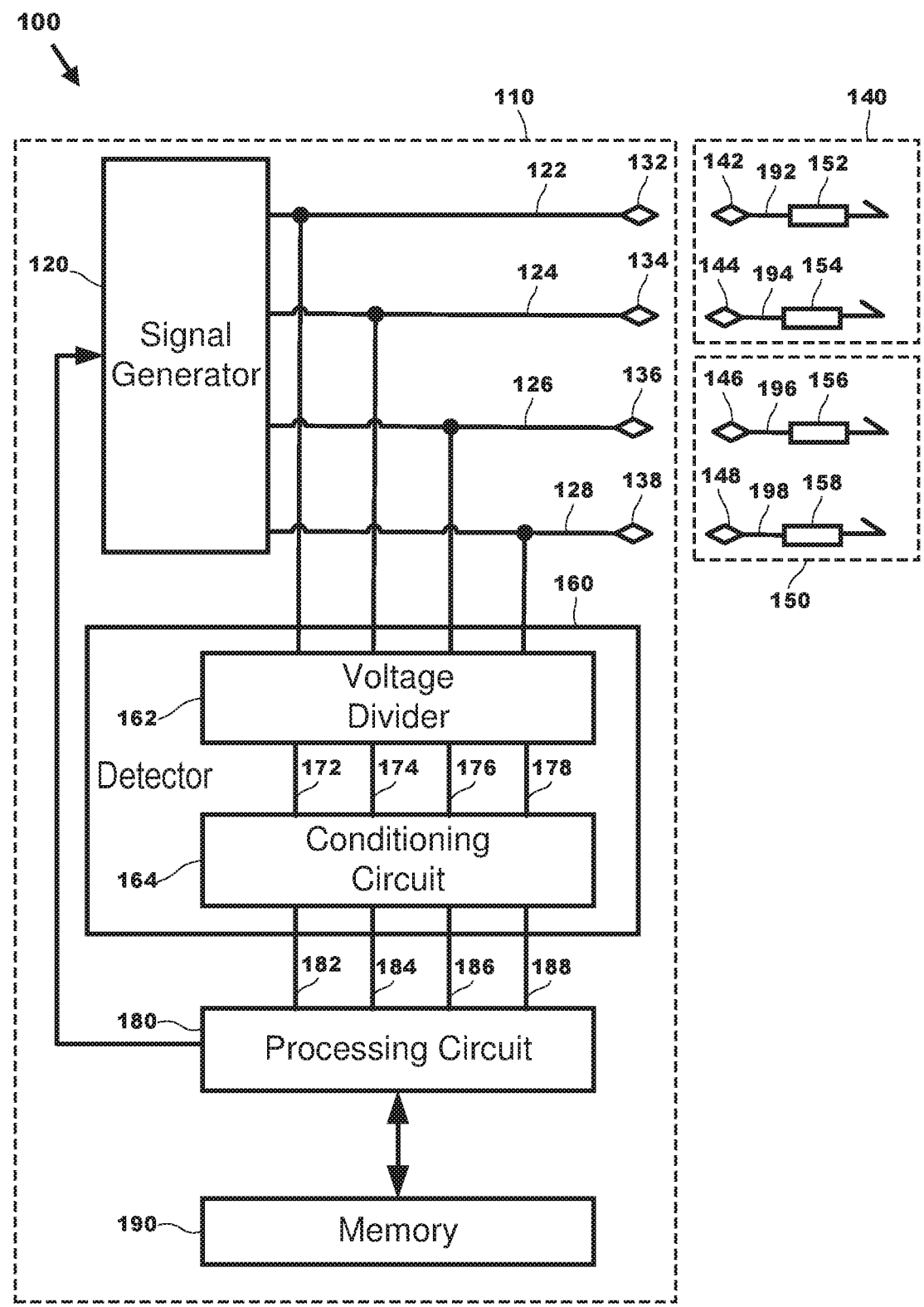
FIG. 1 is a block diagram of the circuit for detecting a magnitude of the voltage of a stimulus signal of a conducted electrical weapon ("CEW") according to various aspects of the present disclosure.
Figure 2:
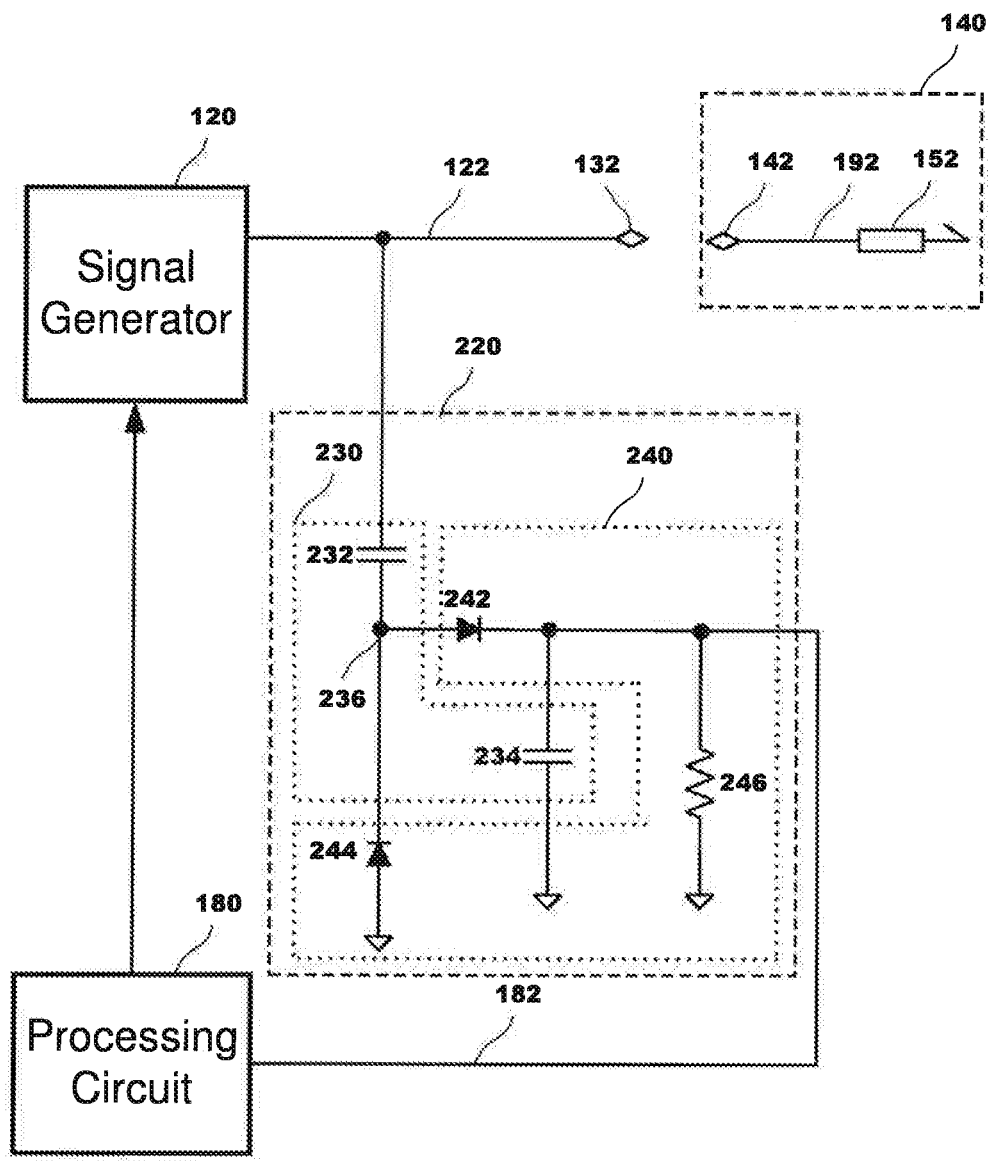
FIG. 2 is an implementation of a circuit for the detecting the magnitude of the voltage of the stimulus signal.

The numerical designators in the drawing indicate the following: 100: conducted electrical weapon; 110: handle; 120: signal generator; 122: conductor; 124: conductor; 126: conductor; 128: conductor; 132: terminal; 134: terminal; 136: terminal; 138: terminal; 140: deployment unit; 142: conductor; 144: conductor; 146: conductor; 148: conductor; 150: deployment unit; 152: electrode; 154: electrode; 156: electrode; 158: electrode; 160: detector circuit; 162: voltage divider circuit; 164: conditioning circuit; 172: conductor; 174: conductor; 176: conductor; 178: conductor; 180: processing circuit; 182: conductor; 184: conductor; 186: conductor; 188: conductor; 190: memory; 200: conducted electrical weapon; 210: signal generator; 212: conductor; 214: terminal; 216: conductor; 218: electrode; 220: detector circuit; 230: voltage divider circuit; 232: capacitance; 234: capacitance; 236: conductor; 240: conditioning circuit; 242: diode; 244: diode; 246: resistance; 248: conductor; 250: processing circuit; 252: control for signal generator; 312: pulse of stimulus signal on conductor 122; 314: pulse of stimulus signal on conductor 122; 316: pulse of stimulus signal on conductor 122; 318: pulse of stimulus signal on conductor 122; 322: divided voltage of pulse 312 on conductor 236; 324: divided voltage of pulse 314 on conductor 236; 326: divided voltage of pulse 316 on conductor 236; 328: divided voltage of pulse 318 on conductor 236; 332: conditioned pulse 322 on conductor 182; 334: conditioned pulse 324 on conductor 182; 336: conditioned pulse 326 on conductor 182; 338: conditioned pulse 328 on conductor 182; 400: printed circuit board; 420: dielectric; 422: conductor; 424: conductor; 426: conductor; 428: conductor; 432: conductor; 434: conductor; 436: conductor; 438: conductor; 500: conducted electrical weapon; 510: handle; 700: method; 710: provide step; 712: measure step; 714: calculate step; 716: relate step; 718: record step; 720: store step; 722: compare step; 724: record step; 800: method; 802: select step; 804: send step; 806: measure step; 808: compare step; 810: compare step; 812: compare step; 814: status step; 816: select step; 818: discontinue step; 820: status step; 822: status step; 824: status step; and 826: continue step.

DETAILED DESCRIPTION OF INVENTION

A conducted electrical weapon ("CEW") is a device that provides a stimulus signal to a human or animal target to impede locomotion of the target. A CEW may include a handle and one or more deployment units (e.g., cartridges). Deployment units may removeably insert into a bay of the handle. A deployment unit may include one or more wire-tethered electrodes that are launched by a propellant toward a target to provide the stimulus signal through the target. Providing a stimulus signal to a target via launched electrodes may be referred to as a remote stun. Two or more terminals are positioned on the face of the handle. Terminals may provide a stimulus signal to a target when the terminals are placed proximate or in contact with tissue of the target. Providing a stimulus signal to a target by bringing the terminals proximate to target tissue may be referred to as a local stun.

The stimulus signal may be provided to a target via launched electrodes or via terminals positioned on the face of the handle that are pressed against the target. A stimulus signal inhibits the locomotion of the target. Locomotion may be inhibited by interfering with voluntary use of skeletal muscles and/or causing pain in the target. A stimulus signal that interferes with skeletal muscles may cause the skeletal muscles to lockup (e.g., freeze, tighten, stiffen) so that the target may not voluntarily move.

A stimulus signal may include a plurality of pulses of current (e.g., current pulses). Each pulse of current delivers a current (e.g., amount of charge) at a voltage. A voltage of at least a portion of a pulse may be of sufficient magnitude to ionize air in a gap to establish a circuit to deliver the current of the pulse to a target.

It is beneficial to know whether a particular pulse of a stimulus signal was delivered to the target. The magnitude of the voltage of a pulse of the stimulus signal may provide information as to whether: a pulse of the stimulus signal arced between terminals across the face of the CEW; a pulse of the stimulus signal arced between a launched electrode or terminal and a target to establish an electrical circuit through the target; the electrodes or terminals are coupled to target tissue; or the electrodes or terminals are shorted.

The voltage of a pulse of a stimulus signal may be detected. A processing circuit may detect the magnitude of the voltage of a pulse. A processing circuit may detect a voltage that is derived from the magnitude of the voltage of the pulse. A derived voltage may include a voltage that is a portion (e.g., fraction) of the voltage of the stimulus signal. A derived voltage includes a divided voltage. A derived voltage may be detected via a capacitive coupling to a conductor that provides the pulse of the current.

A CEW may include two or more terminals and/or launch two or more electrodes. A processing circuit may select between three or more electrodes or terminals to provide the stimulus signal to a target. A processing circuit may select electrodes or terminals for providing the stimulus signal to a target in accordance the magnitude of the voltage of one or more pulses of the stimulus signal. A processing circuit may discontinue sending a stimulus signal to an electrode or terminal based on the magnitude of the voltage of a pulse of the stimulus signal. A processing circuit may record the detected voltage of a pulse of the stimulus signal. A processing circuit may record the calculated magnitude of a pulse of the stimulus signal. A processing circuit may report the detected and/or calculated voltage.

For example, CEW 100 in FIG. 1 performs the operations of a CEW as discussed above. CEW 100 may include handle 110, deployment unit 140, and deployment unit 150. Handle 110 may include signal generator 120, conductor 122, conductor 124, conductor 126, conductor 128, terminal 132, terminal 134, terminal 136, terminal 138, detector circuit 160, processing circuit 180, output 182, output 184, output 186, output 188 and memory 190. Detector circuit 160 includes voltage divider 162, conditioning circuit 164, output 172, output 174, output 176, and output 178. Deployment unit 140 includes conductor 142, conductor 144, electrode 152, electrode, 154, conductor 192, and conductor 194. Deployment unit 150 includes conductor 146, conductor 148, and electrode 156, electrode 158, conductor 196, and conductor 198.

A handle performs the functions of a CEW for perform a local stun and cooperates with a deployment unit to perform a remote stun. A handle includes a user interface for enabling activation (e.g., trigger) and control by a user. A handle provides a stimulus signal. A handle includes a source of energy for providing the stimulus signal and performing the functions of a CEW. A handle provides the pulses of current of a stimulus signal. A handle accepts one or more deployment units. A handle may include one or more bays for receiving a respective deployment unit. A deployment unit may be removeable inserted into a bay of a handle for deploying one or more electrodes for providing the stimulus signal to a target via a remote stun. A handle provides signals for launching the electrodes of a deployment unit to provide a remote stun. A handle may include a detector for detecting a magnitude of a voltage of a pulse of the stimulus signal. A handle may deduce information regarding the magnitude of the voltage of a pulse of the stimulus signal. A handle may store information regarding the operation of the handle, the operation of a deployment unit, voltage magnitudes measure with respect to pulses of the stimulus signal, and information deduced regarding the voltage magnitudes. A handle may report stored information to a server and/or a user. A handle provides information to a user via a user interface.

A terminal is formed of a conductive material (e.g., metal). Two or more terminals may be positioned on a face (e.g., end portion) of a handle. A face of a handle includes the portion of the handle where deployment units may be removable inserted. A handle may provide a stimulus signal between two terminals. Providing the stimulus signal between two terminals, in the absence of a conductive path (e.g., deployment unit, launched electrodes, target tissue) permits each pulse of the stimulus signal to arc (e.g., ionize) across the face of the handle. Placing the terminals proximate to target tissue and providing a stimulus signal between the terminals delivers the stimulus signal through the target to provide a local stun. After launch of electrodes from a deployment unit, terminals may provide the stimulus signal to the deployment unit for deliver to the target via the launched electrodes to provide a remote stun.

As discussed above, a deployment unit cooperates with a handle to launch one or more electrodes toward a target to provide the stimulus signal to the target to perform a remote stun. A cartridge may be removeable inserted into a bay of a handle. A deployment unit may receive a signal from a handle to launch the electrodes of the deployment unit. A deployment unit may include a propulsion system, activated by the signal from the handle, to launch the one or more electrodes of the deployment unit. Each electrode is electrically coupled to a deployment unit via a filament. A handle may provide a stimulus signal to a deployment unit, which in turn provides the stimulus signal to the one or more electrodes via the respective filaments of the electrodes. A handle may provide a stimulus signal to a deployment unit by providing the stimulus signal across the terminals of the handle. The stimulus signal may arc (e.g., ionize) air in a gap between the terminals and conductors of the deployment unit to provide the stimulus signal to the deployment unit.

An electrode, as discussed above, couples to a filament and is launched toward a target to deliver a stimulus signal through the target. Movement of an electrode out of a deployment unit toward a target deploys (e.g., pulls) the filament so that it extends from the cartridge in the handle to the electrode at the target. An electrode may be formed of a conductive material (e.g. metal) for delivery of the stimulus signal into target tissue. A CEW may provide a stimulus signal to target tissue between two electrodes. Providing the stimulus signal between two electrodes may deliver the stimulus signal through the target to provide a remote stun. A handle may provide the stimulus signal between the electrodes at a relatively high voltage to ionize air in gaps between the electrodes and target tissue to electrically couple the electrodes to the target to provide the stimulus signal.

A filament (e.g., tether, wire) conducts a stimulus signal. A filament may be formed of a wire that is insulated or uninsulated. A filament electrically couples a conductor of a deployment unit to an electrode. A filament carries a stimulus signal to an electrode positioned proximate to target tissue to provide the stimulus signal to the target to impede locomotion of the target. A filament mechanically couples to an electrode. A filament mechanically couples to a deployment unit. A filament deploys upon launch of an electrode to extend (e.g., stretch, deploy) between a deployment unit in a handle and a target. Movement of an electrode away from a deployment unit may deploy a filament.

A conductor conducts electricity. A conductor may provide a path for a handle to provide a stimulus signal to a deployment unit. A terminal of a handle may be proximate to a conductor of a deployment unit. The stimulus signal may ionize air in a gap between a terminal of a handle and a conductor of a deployment unit to provide a stimulus signal to an electrode of the deployment unit.

A processing circuit includes any circuitry and/or electrical/electronic subsystem for performing a function. A processing circuit may include circuitry that performs (e.g., executes) a stored program. A processing circuit may include a digital signal processor, a microcontroller, a microprocessor, an application specific integrated circuit, a programmable logic device, logic circuitry, state machines, MEMS devices, signal conditioning circuitry, communication circuitry, a conventional computer (e.g., server), a conventional radio, a network appliance, data busses, address busses, and/or a combination thereof in any quantity suitable for performing a function and/or executing one or more stored programs.

A processing circuit may further include conventional passive electronic devices (e.g., resistors, capacitors, inductors) and/or active electronic devices (op amps, comparators, analog-to-digital converters, digital-to-analog converters, current sources, programmable logic). A processing circuit may include conventional data buses, output ports, input ports, timers, memory, and arithmetic units.

A processing circuit may provide and/or receive electrical signals whether digital and/or analog in form. A processing circuit may provide and/or receive digital information (e.g., data) via a conventional bus using any conventional protocol. A processing circuit may receive information, manipulate the received information, and provide the manipulated information. A processing circuit may store information and retrieve stored information. Information received, stored, and/or manipulated by the processing circuit may be used to perform a function and/or to perform a stored program.

A processing circuit may control the operation and/or function of other circuits and/or components of a system. A processing circuit may receive status information regarding the operation of other components (e.g., status, feedback). A processing circuit may perform calculations (e.g., operations) with respect to the status information. A processing circuit may provide commands to one or more other components in accordance with calculations. For example, a processing circuit may request the status of a component, analyze the status, and command components to start operation, continue operation, alter operation, suspend operation, or cease operation responsive to the status. Commands and/or status may be communicated between a processing circuit and other circuits and/or components via any type of bus including any type of conventional data/address bus.

A handle may include a processing circuit. A processing circuit may control the operation of the components and/or circuits of a handle to perform the functions of the handle discussed herein. A processing may detect input from a user interface (e.g. trigger). A processing circuit may control launch of electrodes. A processing circuit may control activation of the stimulus signal. A processing circuit in cooperation with other components may detect the magnitude of the voltage of a pulse of a stimulus signal. A processing circuit may deduce information from the magnitude of the voltage of a pulse of the stimulus signal. A processing circuit may select the pair of electrodes to deliver a stimulus signal to the target. A processing circuit may select the pair of electrodes responsive to information deduced from the magnitude of the voltage of the pulse of the stimulus signal.

A processing circuit may store information in memory regarding the operation of the handle, the operation of a deployment unit, voltage magnitudes measure with respect to pulses of the stimulus signal, and information deduced regarding the voltage magnitudes. A processing circuit may report stored information to a server and/or a user. A processing circuit provides may information to a user via a user interface.

A memory may store information. A memory may provide previously stored information. A memory may provide previously stored information responsive to a request for information. A memory may store information in any conventional format. A memory may store electronic digital information. A memory may provide stored data as digital information. A memory may store information regarding the operation of the handle, the operation of a deployment unit, voltage magnitudes measure with respect to pulses of the stimulus signal, and information deduced regarding the voltage magnitudes.

A memory includes any semiconductor, magnetic, optical technology, or combination thereof for storing information. A memory may receive information from a processing circuit for storage. A processing circuit may provide a memory a request for previously stored information. Responsive to the request the memory may provide stored information to a processing circuit.

A memory may include any circuitry for storing program instructions and/or data. Storage may be organized in any conventional manner (e.g., program code, buffer, circular buffer). Memory may be incorporated in and/or accessible by a transmitter, a receiver, a transceiver, a sensor, a controller, and a processing circuit.

A signal generator in a CEW generates a stimulus signal for delivery through a human or animal target via the electrodes (e.g., remote stun) or terminals (e.g., local stun) to impede locomotion of the target. A signal generator provides a stimulus signal. A stimulus signal may include a series of current pulses. Each pulse of a stimulus signal may be provided at a voltage. A signal generator may provide a stimulus signal at a voltage of sufficient magnitude to ionize air in one or more gaps in series with the signal generator and the target to electrically couple the CEW to the target. A pulse of a conventional stimulus signal may include a high voltage portion for ionizing air in gaps to establish electrical coupling and lower voltage portion for providing current through target tissue to impede locomotion of the target. A CEW may remain electrically coupled to a target during the time that the air in the gap remains ionized.

A signal generator includes circuits for receiving electrical energy and for providing the stimulus signal. Electrical/electronic components in the circuits of a signal generator may include capacitors, resistors, inductors, spark gaps, transformers, silicon controlled rectifiers, and analog-to-digital converters. A processing circuit may cooperate with and/or control the circuits of a signal generator to produce the stimulus signal.

A signal generator may receive electrical energy from a power supply. A signal generator may convert the energy into a stimulus signal for ionizing gaps of air and interfering with locomotion of a target. A processing circuit may cooperate with and/or control a power supply to provide energy to a signal generator.

A signal generator of a CEW may provide a high voltage, in the range of 40,000 to 50,000 volts, to ionize the air in gaps (e.g., clothes) between an electrode or terminal and a target.

Ionizing the air establishes a low impedance ionization path for delivering a current from the terminal or electrode through the ionization path into target tissue. After the air in a gap is ionized, the ionization path will persist (e.g., remain in existence) as long as sufficient current is provided via the ionization path. When the current provided via the ionization path ceases or is reduced below a threshold, the ionization path collapses (e.g., ceases to exist) and the terminal or electrode is no longer electrically coupled to target tissue. A high voltage in the range of about 50,000 volts can ionize air in a gap of up to about one inch.

For example, signal generator 120 couples to terminal 132, terminal 134, terminal 136, and terminal 138 via conductor 122, conductor 124, conductor 126, and conductor 128 respectively. Terminal 132 and terminal 134 may be position proximate to conductor 142 and conductor 144 of deployment unit 140 while deployment unit 140 is inserted into a bay of handle 110. Terminal 136 and terminal 138 may be position proximate to conductor 146 and conductor 148 of deployment unit 150 while deployment unit 150 is inserted into a bay of handle 110. Conductor 142, conductor 144, conductor 146, and conductor 148 couple to electrode 152, electrode 154, electrode 156, and electrode 158 via filament 192, filament 194, filament 196, and filament 198 respectively.

A pulse of a stimulus signal may be delivered to a target via any electrode and the conductors, terminal and filament associated with the electrode. A pulse of a stimulus signal may be delivered to a target via any terminal and the conductor associated with the terminal. Two terminals or two electrodes may cooperate to provide a stimulus signal to a target.

For example, signal generator 120 may provide a stimulus signal to a target via terminal 132 (e.g., via conductor 122) and terminal 134 (e.g., via conductor 124) or terminal 132 and terminal 138 (e.g., via conductor 128) or terminal 136 (e.g., via conductor 126) and terminal 138 or terminal 136 and terminal 134 while the terminals are positioned proximate to target tissue.

Signal generator 120 may provide a stimulus signal to a target via electrode 152 (e.g., via conductor 122, terminal 132, ionized air in gap, conductor 142, filament 192) and electrode 154 (e.g., via conductor 124, terminal 134, ionized air in gap, conductor 144, filament 194) or electrode 152 and electrode 158 (e.g., via conductor 128, terminal 138, ionized air in gap, conductor 148, filament 198) or electrode 156 (e.g., via conductor 126, terminal 136, ionized air in gap, conductor 146, filament 196) and electrode 158 or electrode 156 and electrode 154 while the electrode are positioned proximate to target tissue.

The signal generator may couple to a detector. A detector detects (e.g., measures, witnesses, discovers, determines) a physical property. A physical property may include any physical property (e.g., momentum, capacitance, electric charge, electric impedance, electric potential, frequency, magnetic field, magnetic flux, mass, pressure, temperature). A detector may detect a quantity, a magnitude, and/or a change in a physical property directly and/or indirectly. A detector may detect a physical property and/or a change in a physical property of an object. A detector may detect a physical quantity directly and/or indirectly. A detector may detect one or more physical properties and/or physical quantities at the same time (e.g., in parallel), at least partially at the same time, or serially. A detector may deduce (e.g., infer, determine, calculate) information related to a physical property and/or quantity. A physical quantity may include a magnitude of voltage, an amount of time, an elapse of time, a magnitude of electric current, an amount of capacitance, an amount of resistance.

A detector may transform a detected physical property to another physical property. A detector may transform (e.g., mathematical transformation) a detected physical quantity. A detector may relate a detected physical property and/or physical quantity to another physical property and/or physical quantity. A detector may detect one physical property and/or physical quantity and deduce another physical property and/or physical quantity.

A detector may provide force to detect a physical property and/or a physical quantity. A force may include an electromotive force. A force may be provided before, coincident with, and/or after detecting. A force may be provided once, periodically, repeatedly, and/or as needed. An electromotive force may produce a direct current ("DC") or can alternating current ("AC"). For example, a detector may provide a voltage to detect a capacitance. A detector may provide a voltage to detect a capacitance any an interval related to the expected rate of moisture avail for detecting. Providing a force may include providing a charge to a passive resonate circuit to provide the power to the circuit to resonate.

A detector may include and/or cooperate with a processing circuit for detecting, transforming, relating, and deducing physical properties and/or physical quantities. A processing circuit may include any conventional circuit for detecting, transforming, relating, and deducing physical properties and/or physical quantities. For example, a processing circuit may include a voltage sensor, a current sensor, a charge sensor, and/or an electromagnetic signal sensor. A processing circuit may include a processor and/or a signal processor for calculating, relating, and/or deducing. A processing circuit may include a memory for storing and/or retrieving information (e.g., data).

A detector may provide information. A detector may provide information regarding a physical property and/or a change in a physical property. A detector may provide information regarding a physical quantity and/or a change in a physical quantity. A detector may provide information regarding information determined using a processing circuit.

A detector may include a voltage divider circuit and a signal conditioning circuit. A voltage divider reduces (e.g., divides) a magnitude of a voltage. A voltage divider circuit may divide a magnitude of a voltage of a pulse of a stimulus signal. A voltage divider may be implemented using any conventional technology and/or technique. In an implementation, voltage divider 162 is a capacitive divider. Voltage divider 162 reduces the magnitude of the stimulus signals provided by signal generator 120 to a magnitude that may be received by processing circuit 180. For example, voltage divider detects the stimulus signal provided on conductor 122, 124, 126, and 128 and provides a reduced magnitude values of the stimulus signal on output 172, 174, 176, and 178 respectively.

For example, voltage divider may detect a voltage having a magnitude of about 25,000 volts (e.g., absolute value) and provide a voltage of about 3 to 5 volts. The divided voltage may be conditioned prior to providing the voltage to a processing circuit.

A conditioning circuit manipulates (e.g., changes, adjusts, modifies, alters) an electrical signal in such a way that the signal meets the operating (e.g., input) requirements of the circuit that receives the signal. Signal conditioning may include amplification, filtering, converting, voltage limiting, range matching, isolation and any other conventional adjustment and/or processing needed to make the signal suitable for the receiving circuit. A conditioning circuit may prepare a signal for detection by a processing circuit. A conditioning circuit may adjust a voltage level (e.g., limit) and/or a slew rate of a signal so that it may be sampled by a processing circuit. A conditioning circuit may filter a signal to reduce noise in the signal prior to sampling by a processing circuit.

A processing circuit may receive the divided and/or conditioned voltage. For example, processing circuit 190 receives divided voltages via output 182, 184, 186, and 188 of conditioning circuit 164. A processing circuit may store a value of the magnitude of a divided voltage. A processing circuit may perform calculations using divided voltages. A processing circuit may determine a magnitude of a divided voltage prior to being divided.

Signal generator 120 may provide a stimulus signal (e.g., series of current pulses) at one or more outputs of signal generator 120 on conductors (e.g., 122, 124, 126, 128). Conductors 122, 124, 126, and 128 coupled to voltage divider 162. Voltage divider 162 divides the voltage provided on the conductors 122, 124, 126, and 128 and provides a divided voltage to conditioning circuit 164. Conditioning circuit 162 receives the divided voltages from outputs 172, 174, 176, and 178, conditions the divided voltages and provides the divided, conditioned voltages to processing circuit 180 via outputs 182, 184, 186, and 188 respectively.

Detector 220 is an implementation of detector 160. Detector 220 includes voltage divider 230 and conditioning circuit 240. Voltage divider 230 contains capacitance 232, capacitance 234, and conductor 236. Conditioning circuit 240 contains diode 242, diode 244, and resistance 246.

A capacitor may include any physical structure that performs the functions of a capacitor. A resistor includes any physical structure that performs the functions of a resistor.

A pulse of a stimulus signal provided by signal generator 120 on conductor 122 is received by voltage divider 220 on capacitor 232. A respective detector 220 receives pulses of a stimulus signal from conductors 122, 124, 126, and 128 so that the pulses of a stimulus signal provided on any conductor 122, 124, 126, and/or 128 are respectively divided, conditioned and provided to processing circuit 180.

Figure 3:
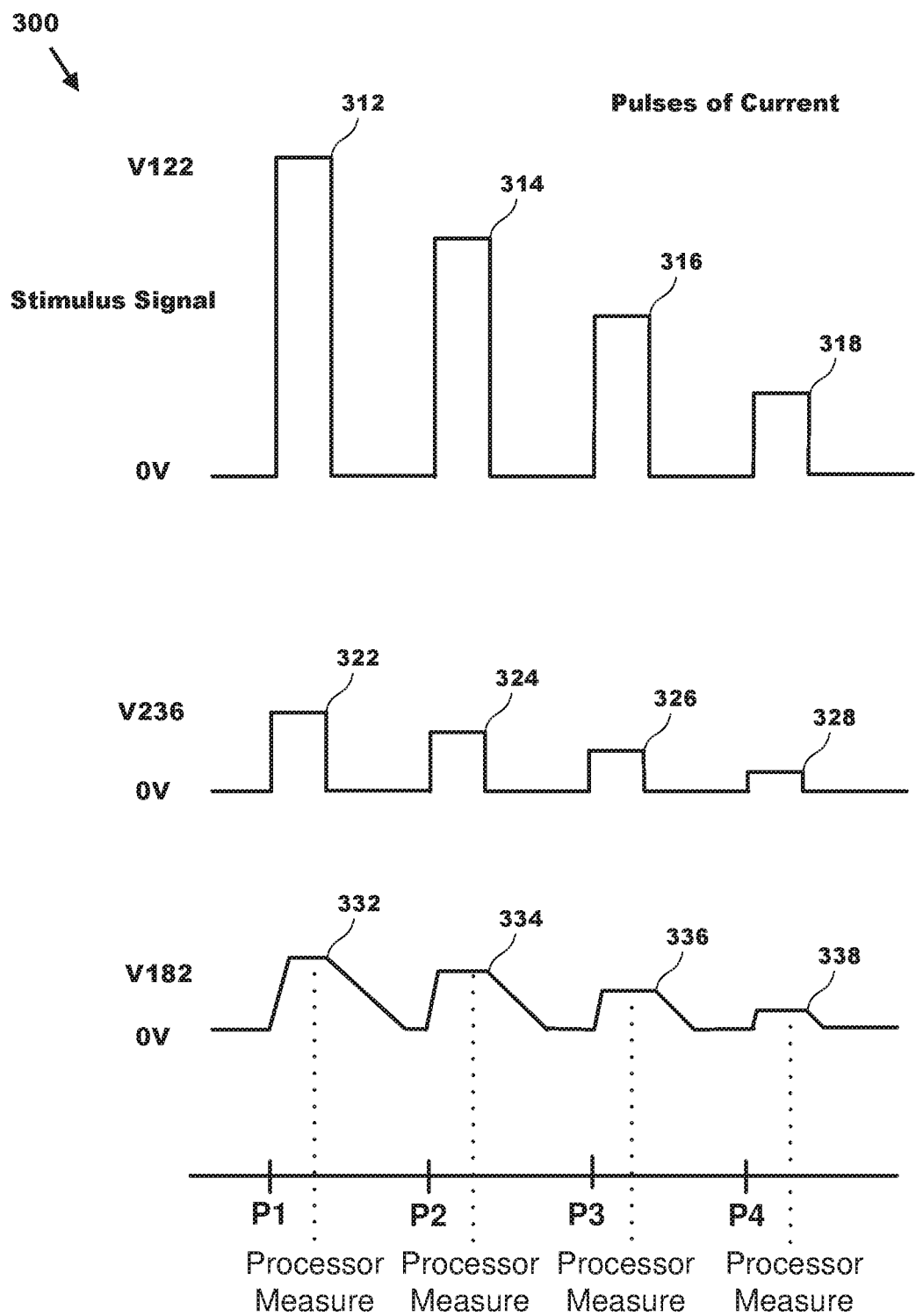
FIG. 3 is a diagram of example voltages of the circuit of FIG. 2.

Voltage divider 230 is implemented as capacitive divider. Capacitors 232 and 234 are coupled in series, so the respective charge stored on capacitors 232 and 234 is equal, but the voltage across capacitors 232 and 234 is different. The charge stored by capacitor 232 or 234 is governed by equation no. 1 below.

$$V=Q/C \quad \text{Equation no. 1:}$$

Where the magnitude of a voltage across the plates of a capacitor is V, the charge stored on plates of a capacitor is Q, and the capacitance of a capacitor is C. The relationship of the magnitude of the voltages of capacitive voltage divider 230 is provided in equation no. 2.

$$V182=V122*C232/(C232+C234) \quad \text{Equation no. 2:}$$

Where the input voltage V122 is the magnitude of the voltage on conductor 122, the output voltage V182 is the magnitude of the voltage on conductor 182, the value of the capacitance on capacitor 232 is C232, and the value of the capacitance on capacitor 234 is C234. Voltage divider 230 is a passive linear circuit that produces an output voltage (e.g., V182) that is a fraction of its input voltage (e.g., V122). In FIG. 3, pulses 322, 324, 326, 328 as measured at node 236 are divided voltages of pulses 312, 314, 316, and 318 as measured at conductor 122.

Signal conditioning circuit 240 prepares the divided voltage for detection by processing circuit 180. Diode 244 restricts (e.g., limits) the divided voltage from becoming negative with respect to ground. Diode 242 prevents current from flowing from signal conditioning circuit 240 back to signal generator 120. Voltages that are too high or too low may damage processing circuit 180. Resistance 246 in cooperation with capacitor 234 filters the divided voltage and slows the rate of change of the divided voltage so that processing circuit 182 may detect the value of the recorded voltage.

Pulses 332, 334, 336, and 338 are conditioned versions of pulses 322, 324, 326, and 328 respectively.

Processing circuit 180 periodically measures the conditioned pulses so that processing circuit 180 measures each pulse 332, 334, 336, and 338. The interval of time at which processing circuit 180 measures the conditioned signal corresponds to the pulses of the stimulus signal provided on conductor 122. Processing circuit can calculate the magnitude of pulse 312 (V122) given the relationship of the magnitude of the voltages of pulse 312 (V122) and pulse 332 (V182) as shown in the equation above.

As discussed above, the magnitude of the voltage (V122) of the stimulus signal is on the order of 50,000 volts. A processing circuit may typically receive voltages in the range of 3 to 5 volts, so voltage divider, voltage divider 230 must divide the magnitude of the voltage of a pulse of the stimulus signal by between 10,000 and 17,000.

As discussed above, a capacitor may be implemented using any physical structures that perform the functions of a capacitor. In an implementation of CEW 100, capacitor 232 may be formed using structures that are already present in CEW 100.

A capacitor may be formed of plates separated by a dielectric. A printed circuit board ("PCB"), such as a conventional PCB used in a CEW, may include conductive traces (e.g., plates) that are separated by a dielectric (e.g., epoxy resin). A trace on a conventional PCB that carries the stimulus signal (e.g., 122, 124, 126, 128) may perform the function of one plate of a capacitor, while another trace added to the other side of the layer may perform the function of the other plate of the capacitor thereby forming capacitor 232. Calculations have shown that a capacitor formed of the materials of a PCB, as described above, provides a capacitor with a capacitance suitable for performing the functions of capacitor 232.

Figure 4:
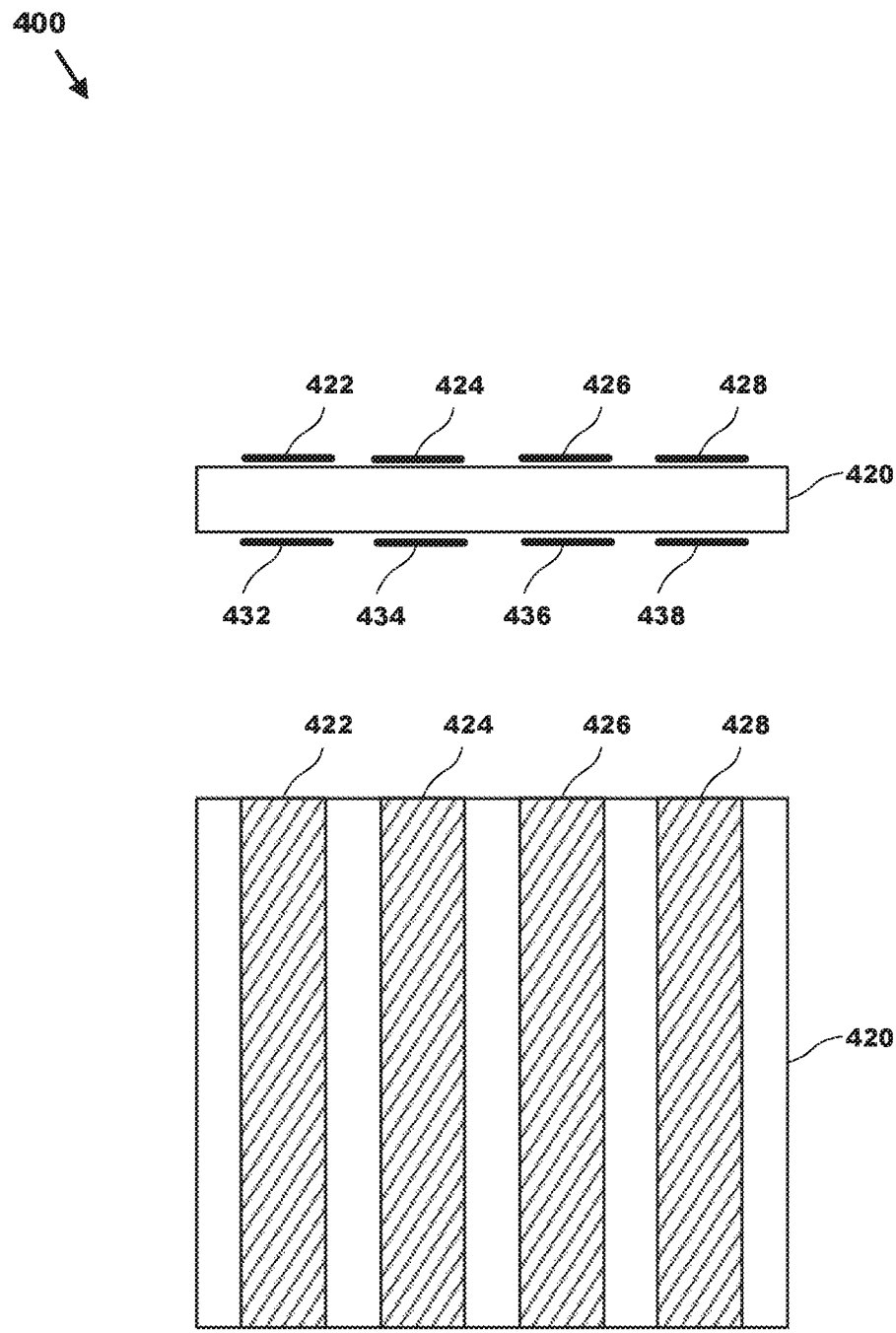
FIG. 4 is an implementation of a circuit with four conductors on one layer of a PCB, four conductors on a second layer of a PCB, the conductors form four capacitances.

In an implementation, FIG. 4. shows PCB 400 includes four conductive traces 422, 424, 426, and 428 on one side (e.g., top) of PCB layer 420. Traces 422, 424, 426, and 428 correspond to conductors 122, 124, 126, and 128 respectively in FIG. 1. Traces 422, 424, 426, and 428 are present on the PCB to carry the stimulus signal to terminals 132, 134, 136, and 138 respectively.

The other side (e.g., bottom) of PCB layer 420 includes conductive traces 432, 434, 436, and 438. Bottom traces 432, 434, 436, and 438 connect to respective conductors 236 for four respective voltage divider circuits.

PCB layer 420 separates the top traces from the bottom traces. Traces 422 and 432, 424 and 434, 426 and 436, and 428 and 438 with layer 420 form four respective capacitors 232 for four respective voltage divider circuits 230.

The capacitance of a capacitor is proportional to the surface area of the plates of the capacitor (e.g., 422/432, 424/434, 426/436, 428/438), inversely related to the distance between the plates, and the dielectric constant of the dielectric between the plates as shown in equation no. 3.

$$C=k*\varepsilon o*A/d \quad \text{Equation no. 3:}$$

C is capacitance of the capacitor formed by the parallel plates of the PCB, k is the relative permittivity of the dielectric material between the plates, εo is the permittivity of space, A is the overlapping surface area of the plates, and d is the distance between the plates. Using the following values, εo=8.854×10−12 F/m, k=4.4 (e.g., relative permittivity of High-voltage polyimide film (HVPF) top laminate for a PCB layer), A=62.5 mm squared (where L=25 mm, W=2.5 mm), and d=1.6 mm, the capacitance of a capacitor (e.g. 232) formed using the traces of a PCB is about 1.5 pF.

To achieve a ratio of 10,000 to 1 the value of capacitance 234 used in voltage divider 230 is approximately 0.015 uF. To achieve a ratio of 17,000 to 1 the value of capacitance 234 used in voltage divider 230 is approximately 0.025 uF.

Verifying the voltage rating of the PCB capacitor 232, HVPF has 112 KV isolation per mm, using a 1.6 mm thick PCB the plate to plate voltage rating of the PCB capacitor is 189 KV.

Figure 5:
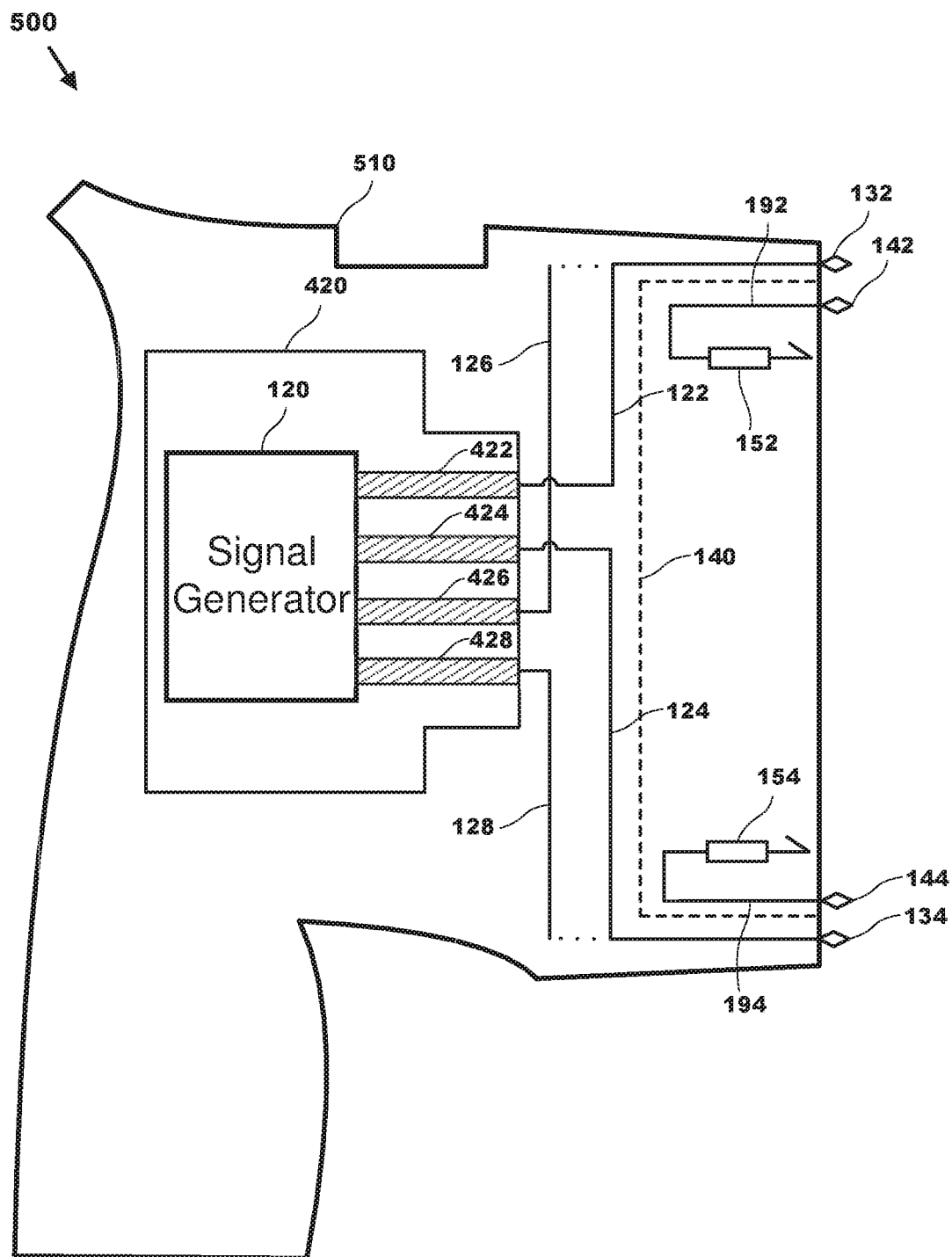
FIG. 5 is an implementation of a CEW with a signal generator coupled to four capacitances formed on a PCB and to four electrodes respectively.

The PCB of FIG. 4 is coupled to signal generator 120 in FIG. 5. Trace 422 (e.g., 122) carries the stimulus signal to terminal 132 while trace 424 (e.g., 124) carries the stimulus signal to terminal 134. Although not shown, trace 426 (e.g., 126) and trace 428 (e.g., 128) carry the stimulus signal to terminals 136 and 138 respectively.

The voltage from each trace 422, 424, 426, and 428 are divided by a respective detector 220 that includes a respective voltage divider 230 that includes a respective capacitor 232 that is formed of trace 422/432, 424/434, 426/436, and 428/438.

Figure 6:
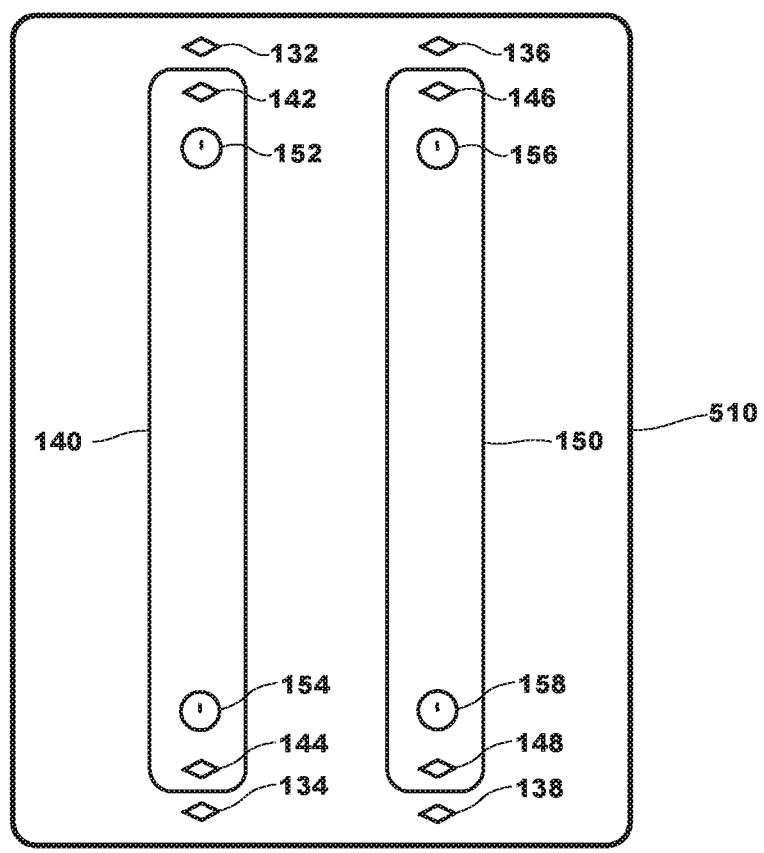
FIG. 6 is a front view of the CEW of FIG. 4.

In an implementation, handle 510, shown in FIGS. 5 and 6, includes deployment units 140 and 150. Terminals 132, 134, 136, and 138 are positioned on the face of handle 510. Conductors 142 and 146 are positioned on an upper portion, with respect to the page, of deployment unit 140 and 150 respectively proximate to conductors 132 and 136 respectively. Conductors 144 and 148 are positioned on an lower portion of deployment unit 140 and 150 respectively proximate to conductors 134 and 138 respectively. A stimulus signal may be provided to a target via a pair of launched electrodes or a pair of terminals that are proximate to target tissue.

For example, a user may launch electrodes 152 and 154 toward a target. As electrodes 152 and 154 fly toward the target, filaments 192 and 194 respectively deploy so that electrodes 152 and 154 remain coupled to deployment unit 140. Launched electrodes 152 and 154 may land proximate to or embedded into target tissue. Processing circuit 180 may instruct (e.g., control) signal generator 120 to provide a stimulus signal to the target via an electrical path formed by signal generator 120, trace 422, conductor 122, terminal 132, ionized air in a gap between terminal 132 and conductor 142, conductor 142, filament 192, electrode 152, possibly another gap of air, target tissue, possibly another gap of air, electrode 154, filament 194, conductor 144, ionized air in a gap between conductor 144 and terminal 134, conductor 124, trace 424, and signal generator 120.

Each time signal generator 120 provides a pulse of the stimulus signal, the capacitance formed by traces 422/432 and traces 424/434 accumulate charge and lose charge thereby causing voltage divider 230 and conditioning circuit 240 to provide a divided and conditioned signal to processing circuit 180. The capacitance formed by traces 422/432 and traces 424/434 take advantage of the properties and layout of the circuit board to form one of the capacitors used to divide the stimulus signal voltage for sampling by processing circuit 180.

Information regarding the magnitude of each pulse of the stimulus signal may provide information regarding delivery of the pulse to the target. Table 1 provides a relationship of the magnitude of a pulse of a stimulus signal and whether the pulse was likely delivered to the target.

TABLE 1

Status of Stimulus Pulses based on the Voltage Magnitude

Calculated Voltage Magnitude

| Range Max | Range Min | Status |
|---|---|---|
| 30 KV | 15 KV | Arcing on front on CEW |
| 15 KV | 5 KV | Arcing to electrically couple to target |
| 5 KV | 1 KV | Embedded into target tissue |
| 1 KV | 0 V | Electrodes are shorted |

In an implementation, a pulse that has a magnitude, as measured at trace 422-428, greater than 15 KV indicates the pulse is likely arching across the front of a handle between terminals and thus is not being delivered to the target. For example, a pulse of the stimulus signal that arcs between terminal 132 to terminal 134 cannot be sending the pulse to a target via electrodes 152 and 154 or cannot be proximate to target tissue because proximity of either electrodes 152 and 154 or terminals 132 and 134 to target tissue would preclude arcing between terminals 132 and 134 because the impedance through a target is less than the impedance of air between terminals 132 and 134.

A magnitude of the voltage of a pulse, as measured at trace 422-428, that is less than 15 KV, but greater than 5 KV likely indicates that the pulse was delivered to the target via launched electrodes, but the electrodes were proximate to, instead of embedded into, target tissue, so the voltage of the pulse ionized air in a gap between one or both electrodes to provide the pulse to the target. When the measured range is between 15 KV and 5 KV, the length of the gap of are between one or more electrodes may be a great as an inch or an inch and one half.

A magnitude of the voltage of a pulse, as measured at trace 422-428, that is less than 5 KV, but greater than 1 KV likely indicates that the launched electrodes are embedded into target tissue so that the pulse was delivered to the target without ionizing air in gaps between the electrode and target tissue. It may also indicate that one or both electrodes are not embedded into target tissue, but that they are positioned close to target tissue so that length of the gap of air that must be ionized to electrically couple the one or more electrodes to the target is short (e.g., less than 0.3 inches).

A magnitude of the voltage of a pulse, as measured at trace 422-428, that is less than 1 KV, but greater than 0 volts likely indicates that the launched electrodes or electrodes and their associated filaments are shorted together.

Figure 7:
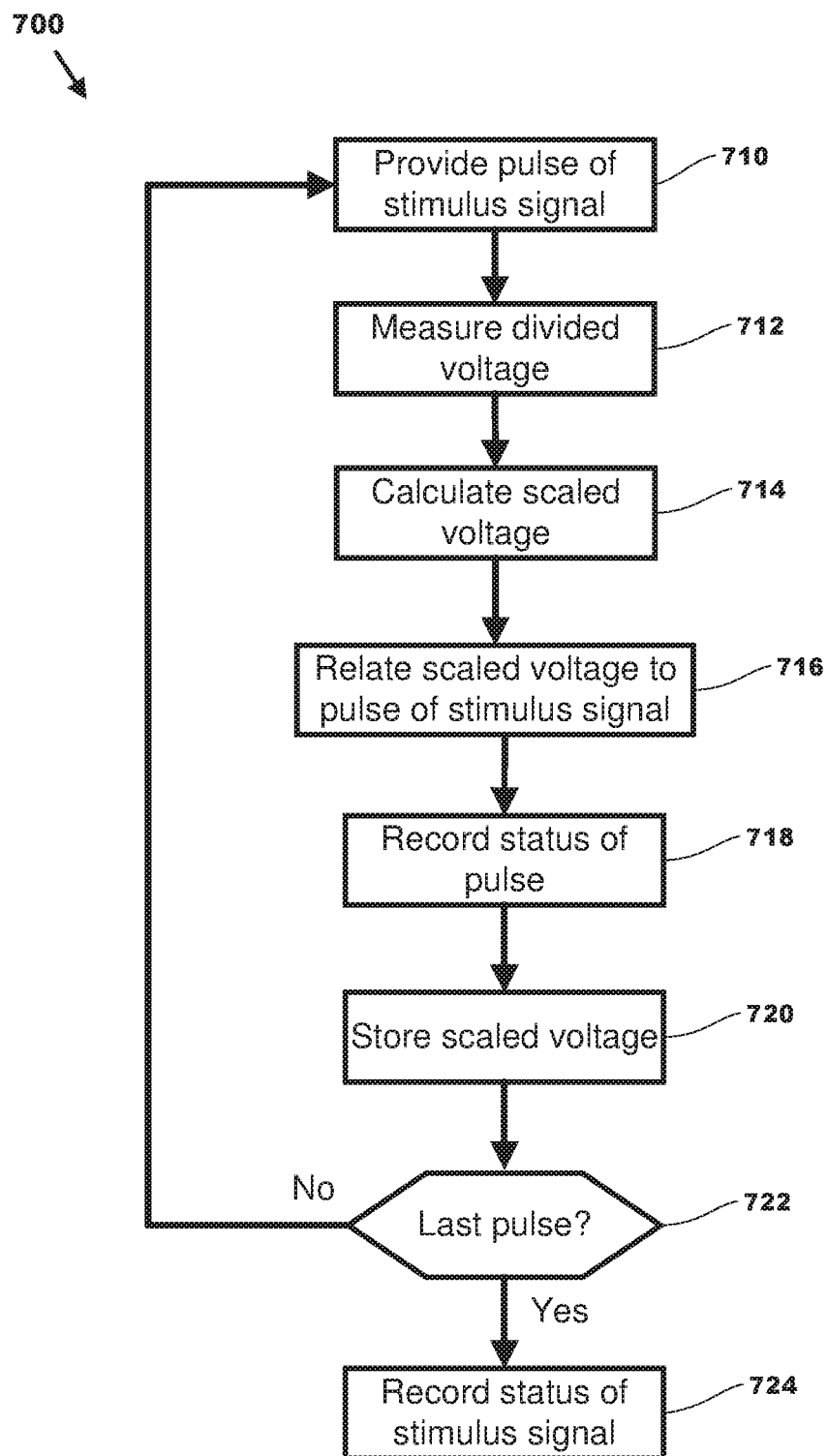
FIG. 7 is a flow chart of an implementation of a method for detecting and recording a magnitude of the voltage of a stimulus signal according to various aspects of the present disclosure.

During delivery of a series of pulses of a stimulus signal, processing circuit 180 of handle 110 may perform method 700 shown in FIG. 7. Method 700 includes provide 710, measure 712, calculate 714, relate 716, record 718, record 720, last 722, and record 724.

In provide 710, processing circuit 180 instructs signal generator 120 to provide a pulse (e.g., 312) of the stimulus signal. The pulse is provided via traces 422-428, which means that voltage divider 230 divides (e.g., 322) the magnitude of the pulse and conditioning circuit 240 conditions (e.g., 332) the pulse.

In measure 712, processing circuit 180 measures (detects, samples, reads) the divided and conditioned signal (e.g., 332).

In calculate 714, processing circuit 180 calculates the magnitude of pulse 312 using Equation 2, given the capacitive values of the voltage divider circuit and the magnitude of the divided and conditioned signal (e.g., 332) measured by processing circuit 180.

In relate 716, processing circuit 180 compares the calculated magnitude of pulse 312 with the ranges of voltages provide in Table 1 to determine a likely status of providing the pulse to a target as discussed above.

In record 718, processing circuit 180 stores in memory the status of pulse 312 as defined in Table 1. In record 720, processing circuit 180 optionally stores in memory the magnitude of the scaled voltage calculate in calculate 714.

In last 722, processing circuit determines whether the last pulse of the stimulus signal has been provided. If the last pulse has been provided, method 700 moves to provide 710, otherwise it proceeds with record 724.

In record 724, processing circuit 180 analyzes the status of each pulse of the stimulus signal as recorded in record 718 and possibly the scaled voltage of each pulse as recorded in record 720 to determine a status of the stimulus signal. Any conventional algorithm (e.g., averaging, minimum, maximum) may be used to determine a relationship between the status of each pulse of a stimulus signal and a status of the stimulus signal. For example, for a portion of a stimulus signal, the status of the pulses may be embedded, but a movement of the target may make the status of the pulses arcing to electrically couple. The status determined for the stimulus signal is stored in memory.

During delivery of a stimulus signal to a target, a processing circuit may monitor the status of each pulse or a status of a stimulus signal to select electrodes for delivery of a next pulse or stimulus signal. For example, if a CEW has launched three or more electrodes toward a target, a processing circuit may monitor the status of pulses and stimulus signals as provided by the various pairs of the launched electrodes to select a pair of electrodes that is the most likely to deliver the stimulus signal to a target.

Figure 8:
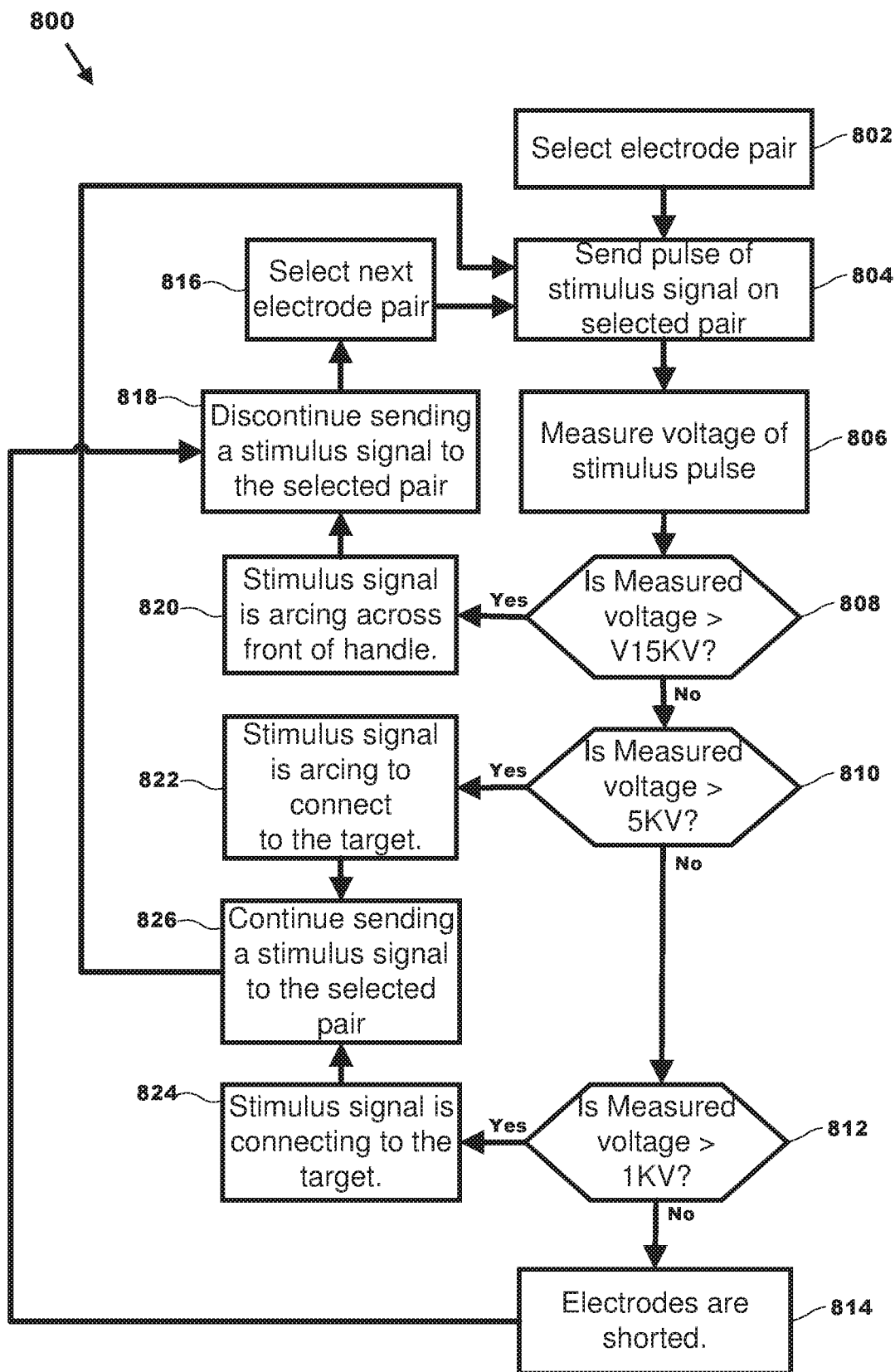
FIG. 8 is a flow chart of an implementation of a method for determining whether to provide the stimulus signal via a pair of electrodes.

For example, a processing circuit of a stimulus signal may perform method 800, of FIG. 8, to select electrodes for delivering a stimulus signal to a target. Method 800 may include steps 802-824. Assume for the discussion regarding method 800 that the CEW has launched three or more, likely four (e.g., 152, 154, 156, 158), electrodes toward a target.

In step 802, processing circuit 180 selects a first pair (e.g., 152, 154) of launched electrodes. In step 804 processing circuit 180 instructs (e.g., controls) signal generator 120 to provide a pulse of the stimulus signal. In step 806, processing circuit 180 measures the magnitude of the divided and conditioned voltage (refer to 712) and calculates the magnitude of the scaled voltage (refer to 714).

In steps 808, 810, and 812, processing circuit 180 compares the magnitude of the scaled voltage to the ranges provided in Table 1. In steps 824, 822, and 820, processing circuit determines the likely status of the electrodes in accordance with the comparison made in steps 808-812. Based on the comparison and the likely status, processing circuit 180 executes step 824 to continue providing the stimulus signal through the presently selected pair of electrodes or processing circuit 180 executes step 818 to discontinue use of the present pair and step 816 to select a new pair of electrodes for delivering the next pulse of the stimulus signal.

Method 800 performs electrode selection for each pulse of a stimulus signal. Method 800 may be modified so that fewer pulses of a stimulus signal are tested and the electrodes selected only after an entire series of pulses of a stimulus signal have been delivered.

The foregoing description discusses embodiments, which may be changed or modified without departing from the scope of the invention as defined in the claims. Examples listed in parentheses may be used in the alternative or in any practical combination. As used in the specification and claims, the words 'comprising', 'comprises', 'including', 'includes', 'having', and 'has' introduce an open-ended statement of component structures and/or functions. In the specification and claims, the words 'a' and 'an' are used as indefinite articles meaning 'one or more'. While for the sake of clarity of description, several specific embodiments of the invention have been described, the scope of the invention is intended to be measured by the claims as set forth below. In the claims, the term "provided" is used to definitively identify an object that not a claimed element of the invention but an object that performs the function of a workpiece that cooperates with the claimed invention. For example, in the claim "an apparatus for aiming a provided barrel, the apparatus comprising: a housing, the barrel positioned in the housing", the barrel is not a claimed element of the apparatus, but an object that cooperates with the "housing" of the "apparatus" by being positioned in the "housing". The invention includes any practical combination of the structures and methods disclosed. While for the sake of clarity of description several specifics embodiments of the invention have been described, the scope of the invention is intended to be measured by the claims as set forth below.

The location indicators "herein", "hereunder", "above", "below", or other word that refer to a location, whether specific or general, in the specification shall be construed to refer to any location in the specification whether the location is before or after the location indicator.

What is claimed is:

1. A conducted electrical weapon ("CEW") for providing a current through a human or animal target for impeding locomotion of the target, the CEW comprising:
   a processing circuit;
   a memory;
   an electrode;
   a signal generator, the signal generator provides a stimulus signal via the electrode for impeding locomotion of the target;
   a voltage divider, the voltage divider coupled to an output of the signal generator, the voltage divider divides a high voltage portion and a low voltage portion of each pulse of the stimulus signal, the high voltage portion for ionizing air in one more gaps, the low voltage portion for providing the current through the target to impede locomotion of the target; wherein the processing circuit:
   detects a magnitude of the divided voltage; and
   records the magnitude of the divided voltage in the memory.

2. The conducted electrical weapon of claim 1 wherein the processing circuit:
   calculates the magnitude of the voltage of the stimulus signal; and
   in accordance with the magnitude of the voltage of the stimulus signal determines at least one of whether the stimulus signal arced across a face of the CEW and whether arced to establish an electrical connection with the target.

3. The conducted electrical weapon of claim 2 wherein the processing circuit further records the magnitude of the voltage of the stimulus signal in the memory.

4. The conducted electrical weapon of claim 1 wherein the processing circuit in accordance with the magnitude of the divided voltage determines at least one of whether the stimulus signal arced across a face of the CEW and arced to establish an electrical connection with the target.

5. The conducted electrical weapon of claim 1 wherein the processing circuit in accordance with the magnitude of the divided voltage further determines at least one of whether the electrode is embedded in the target and whether the electrode is shorted.

6. The conducted electrical weapon of claim 1 wherein the processing circuit in accordance with the magnitude of the divided voltage instructs the signal generator to provide a next stimulus signal to a next electrode selected by the processing circuit.

7. The conducted electrical weapon of claim 1 wherein the higher voltage portion of each pulse of the stimulus signal is between 40,000 and 50,000 V.

8. The conducted electrical weapon of claim 1 wherein the voltage divider comprises a first capacitor and a second capacitor coupled in series.

9. The conducted electrical weapon of claim 8 wherein the first capacitor is formed of a printed circuit board.

10. The conducted electrical weapon of claim 9 wherein the printed circuit board comprises:

a dielectric printed circuit board layer having a first side and a second side;
a first conductive trace on the first side of the dielectric printed circuit board layer; and
a second conductive trace on the second side of the dielectric printed circuit board layer.

11. The conducted electrical weapon of claim 1 further comprising a signal conditioning circuit configured to condition the divided voltage for processing by the processing circuit.

12. The conducted electrical weapon of claim 11 wherein the signal conditioning circuit comprises a first diode configured to prevent the value of the divided voltage from becoming negative with respect to ground.

13. The conducted electrical weapon of claim 11 wherein the signal conditioning circuit comprises a resistor configured to slow a rate of change of the value of the divided voltage for processing by the processing circuit.

* * * * *